(12) United States Patent
Ivey

(10) Patent No.: US 10,694,636 B2
(45) Date of Patent: Jun. 23, 2020

(54) ELECTRONIC RACK CROWN

(71) Applicant: MITEK CORP., INC., Phoenix, AZ (US)

(72) Inventor: Johnathan Ivey, Chandler, AZ (US)

(*) Notice: Subject to any disclaimer, the term of this patent is extended or adjusted under 35 U.S.C. 154(b) by 0 days.

(21) Appl. No.: 16/288,447

(22) Filed: Feb. 28, 2019

(65) Prior Publication Data
US 2019/0373760 A1 Dec. 5, 2019

Related U.S. Application Data

(63) Continuation-in-part of application No. 16/022,077, filed on Jun. 28, 2018, now Pat. No. 10,330,299, which is a continuation-in-part of application No. 15/994,721, filed on May 31, 2018, now Pat. No. 10,356,936.

(51) Int. Cl.
| | |
|---|---|
| *H05K 7/18* | (2006.01) |
| *H05K 1/02* | (2006.01) |
| *H04R 1/08* | (2006.01) |
| *H04R 1/02* | (2006.01) |

(52) U.S. Cl.
CPC ............. *H05K 7/186* (2013.01); *H04R 1/026* (2013.01); *H04R 1/083* (2013.01); *H05K 1/0296* (2013.01)

(58) Field of Classification Search
CPC .... H05K 7/186; H05K 1/0296; H05K 7/1494; H04R 1/026; H04R 1/083; H04R 1/028
See application file for complete search history.

(56) References Cited

U.S. PATENT DOCUMENTS

| | | | | |
|---|---|---|---|---|
| 6,006,925 | A * | 12/1999 | Sevier | H04Q 1/09 211/189 |
| 7,255,640 | B2 * | 8/2007 | Aldag | H05K 7/20572 361/676 |
| 2003/0033546 | A1 * | 2/2003 | Bresniker | G06F 1/18 713/300 |
| 2008/0276505 | A1 * | 11/2008 | Hinshaw | G09F 13/04 40/541 |
| 2015/0002006 | A1 * | 1/2015 | Segroves | H05K 7/1491 312/236 |
| 2017/0354054 | A1 * | 12/2017 | Kaplan | A47B 81/06 |

* cited by examiner

*Primary Examiner* — Abhishek M Rathod
(74) *Attorney, Agent, or Firm* — Keith L. Jenkins, Registered Patent Attorney LLC; Keith L. Jenkins

(57) ABSTRACT

An electronics rack crown for facilitating communications between a user of said electronics rack and a remote entity. The rack crown is responsive to door events and data inputs, externally visually signaling fault conditions in electronic modules mounted in the rack, automatically communicating alarms or anomalies via the Internet to the remote entity, providing an interchangeable user brand logo panel, and providing for configuration via an array of configuration DIP switches or by SD card. The electronics rack crown includes a framed video screen, at least one loudspeaker, and a microphone. An electronics compartment houses a PCB board that provides communications, data processing, executive functions, and audio and video signal processing.

20 Claims, 10 Drawing Sheets

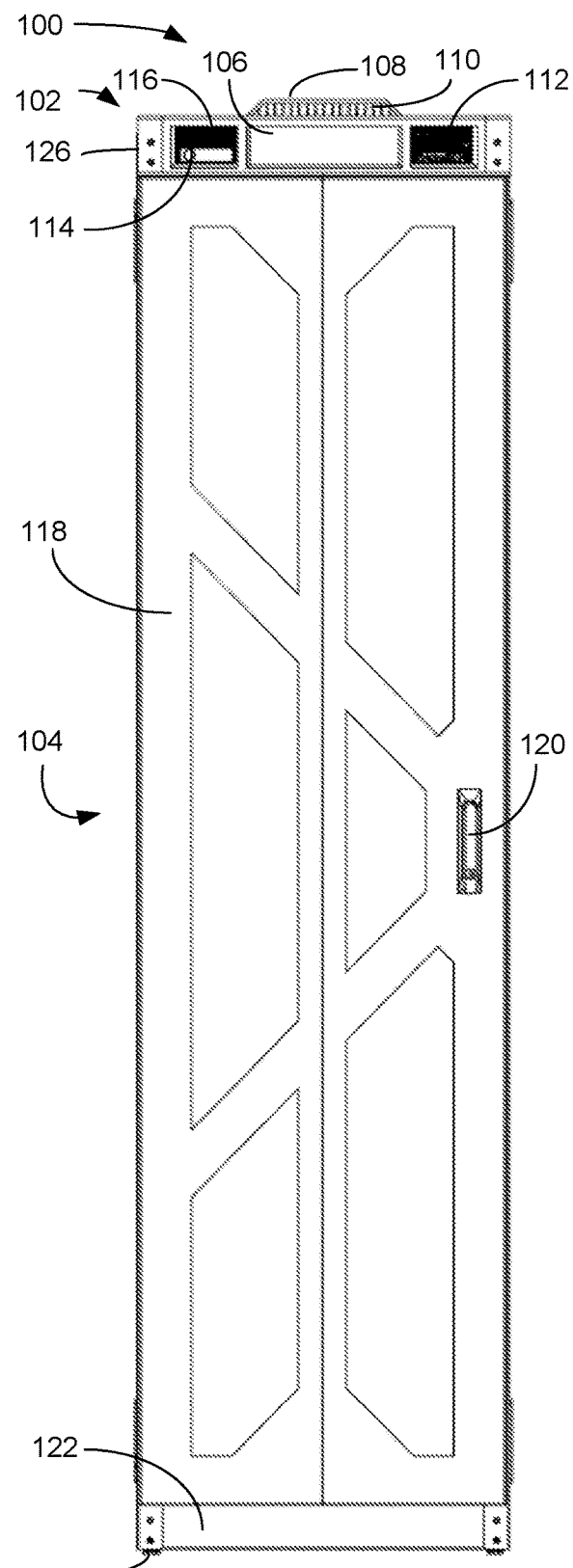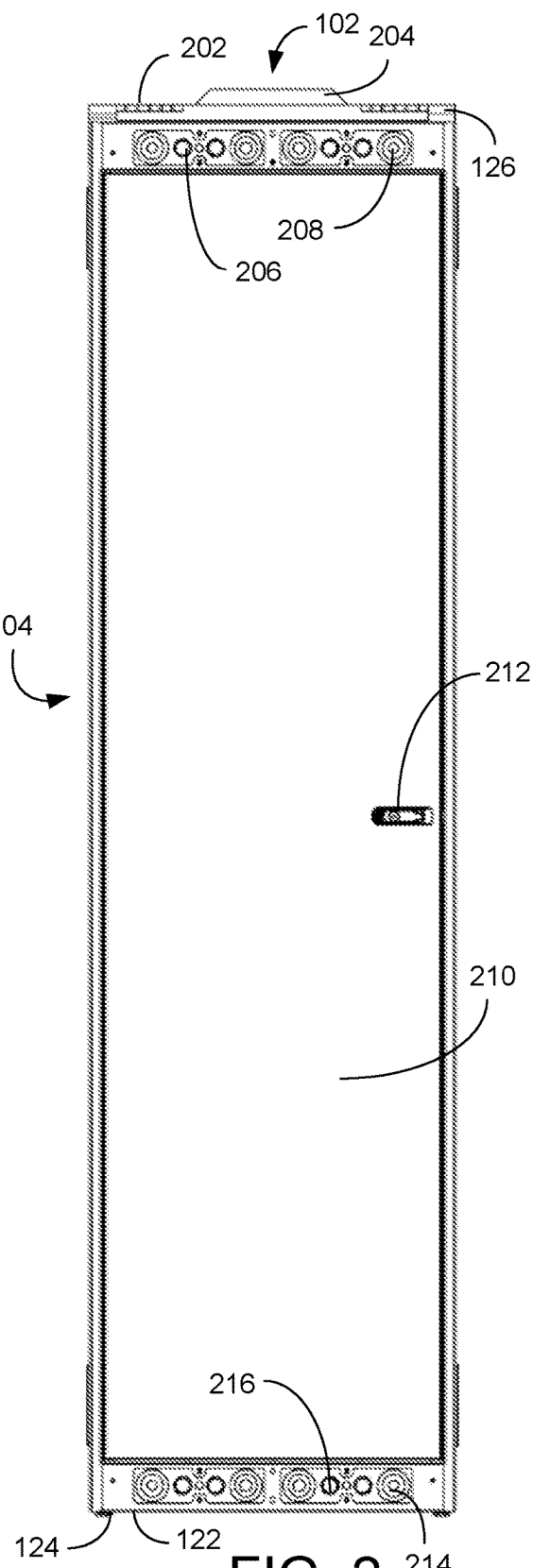
FIG. 1
FIG. 2

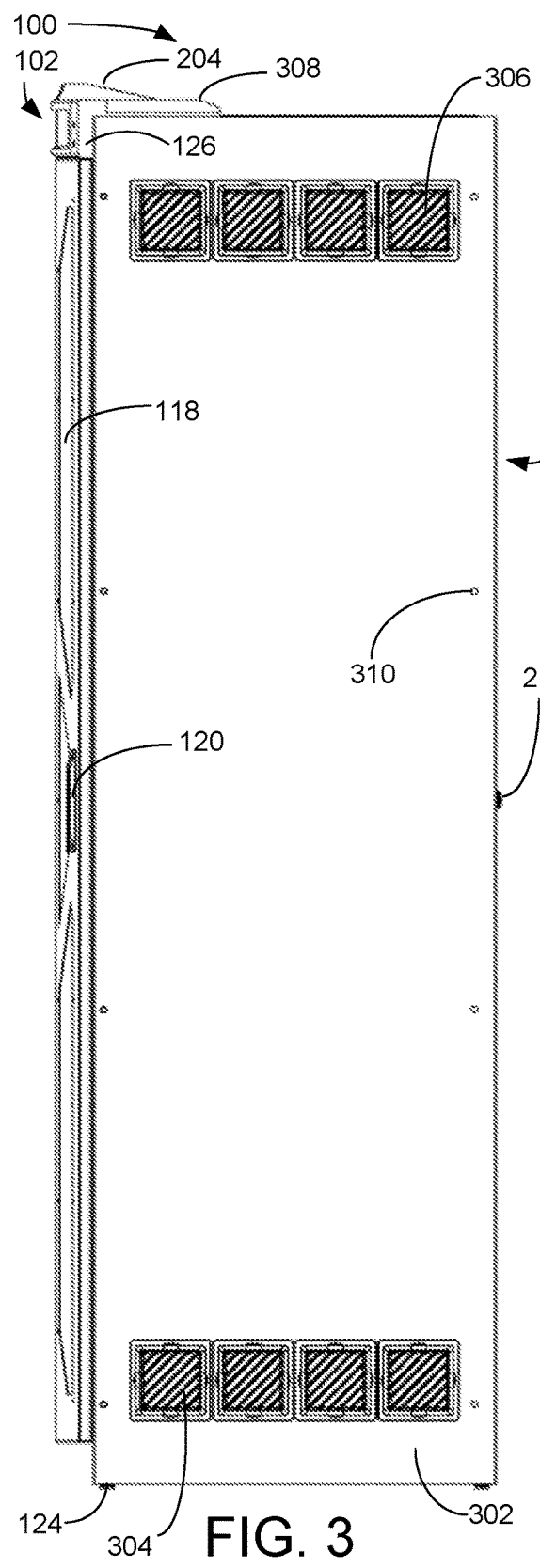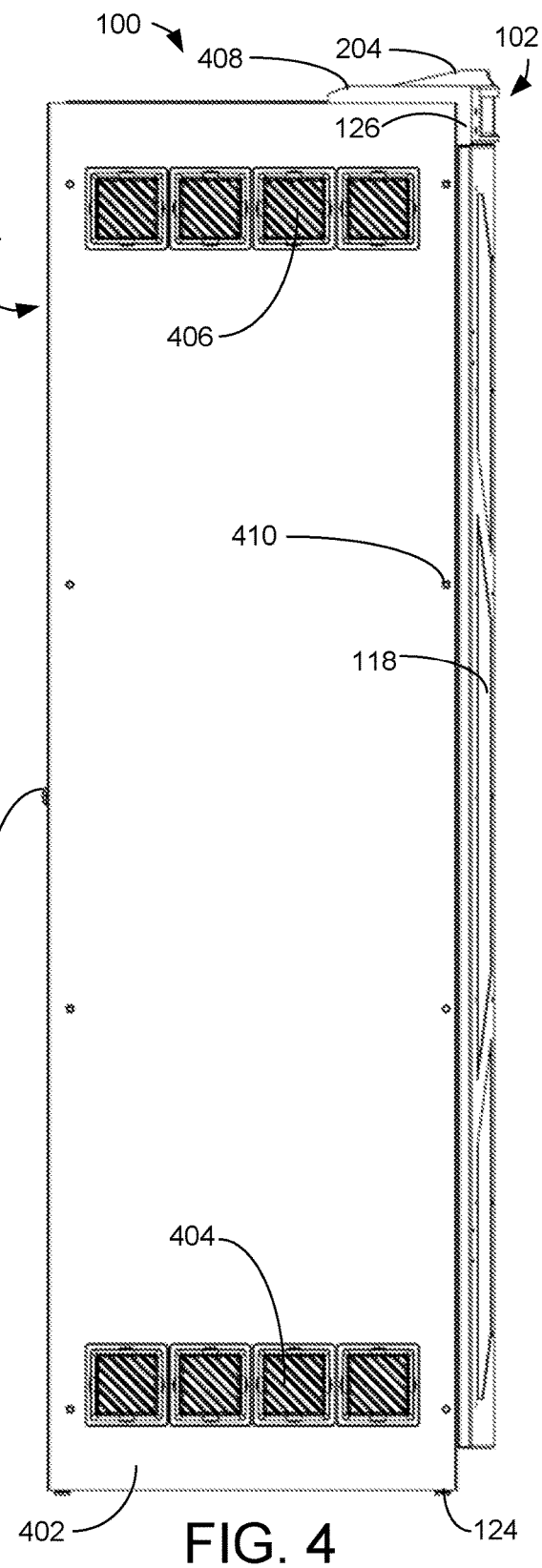

ELECTRONIC RACK CROWN

RELATIONSHIP TO OTHER APPLICATIONS

This application is a continuation in part of U.S. patent application Ser. No. 16/022,077 filed Jun. 28, 2018 to at least one common inventor, which is a continuation-in-part of U.S. patent application Ser. No. 15/994,721 filed May 31, 2018 to the same inventor, which applications are incorporated herein by reference.

FIELD OF ART

The present invention relates to accessories for electronics racks. The present invention more particularly relates to a rack crown providing multiple services to an electronics rack user.

BACKGROUND OF THE INVENTION

Electronics racks are ubiquitous for server farms, telecommunications, and other electronic system supports. Especially in large installations that include many electronics racks, quickly identifying which rack contains a faulty electronics module can be difficult. Another difficulty with conventional electronics racks is that they have poor lighting for illuminating the labels on the fronts of electronic component modules. Another difficulty with conventional electronics racks is that user brand labeling is typically permanent and so creates a market obstacle to reselling or repurposing used electronics racks. Finally, conventional electronics racks do not have means for communicating between a technical assistant and a user for troubleshooting purposes.

SUMMARY OF THE INVENTION

The present invention provides an improved rack crown for the top of an electronics rack that provides visual and audible communication to remote entities, including providing notices of anomalies such as, without limitation, over temperature conditions, excessive moisture, voltage issues, and door breaching. Notices may be, without limitation, via email, texting, voice messaging, or live calling. The improved rack crown also includes replaceable user brand labeling, fault detection messaging. The present invention is described as an adjunct to the DIN rail electronics rack of U.S. patent application Ser. No. 15/994,721 however, the invention is not so limited. An adapter kit may be required to fit on various electronics racks.

DESCRIPTION OF THE FIGURES OF THE DRAWINGS

The present invention will hereinafter be described in conjunction with the following drawing figures, wherein like reference numerals denote like elements, and FIG. 1 is a front elevation view illustrating an exemplary embodiment of an improved electronics rack crown mounted on an electronic rack cabinet, according to a preferred embodiment of the present invention;

FIG. 2 is a rear elevation view illustrating the exemplary embodiment of the improved electronics rack crown of FIG. 1 mounted on the electronic rack cabinet of FIG. 1, according to a preferred embodiment of the present invention;

FIG. 3 is a right-side elevation view illustrating the exemplary embodiment of the improved electronics rack crown of FIG. 1 mounted on the electronic rack cabinet of FIG. 1, according to a preferred embodiment of the present invention;

FIG. 4 is a left-side elevation view illustrating the exemplary embodiment of the improved electronics rack crown of FIG. 1 mounted on the electronic rack cabinet of FIG. 1, according to a preferred embodiment of the present invention;

DETAILED DESCRIPTION OF THE INVENTION

Figure 5:
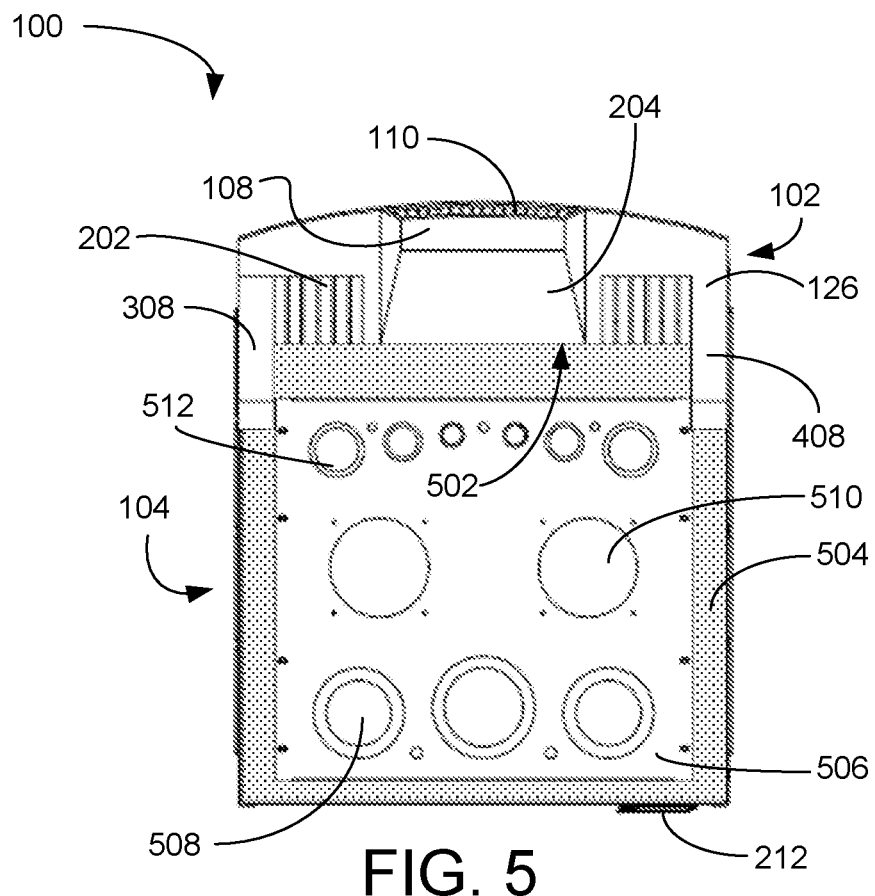
FIG. 5 is top plan view illustrating the exemplary embodiment of the improved electronics rack crown of FIG. 1 mounted on the electronic rack cabinet of FIG. 1, according to a preferred embodiment of the present invention.

As used and defined herein, words of relative position such as "top," "bottom," "front," "rear," "left," and "right" refer to the operational orientation as shown in FIGS. 1-6 as seen from the view of FIG. 1. The hundreds digit(s) of reference numbers are the figure number of the first drawing in regard to which the referenced item was first described in the specification. Reference 126 is used to refer to the structure of the crown rack while reference number 102 is used to refer to the combination of the structure of the crown rack and all items mounted on or attached to the structure of the crown rack.

FIG. 1 is a front elevation view illustrating an exemplary embodiment 100 of an improved electronics rack crown 102 mounted on an electronic rack cabinet 104, according to a preferred embodiment of the present invention. Improved electronics rack crown 102 includes a rack crown structure 126, video screen 106, a raised vent cover 108 for passive vent set 110, a left loudspeaker outer grill 116, a right loudspeaker outer grill 112, and a push button switch 114 for initiating voice communications, preferably over the Internet. In various other embodiments, respectively various voice communication methods may be used. Preferably, the Internet voice communication is a Session initiation Protocol (SiP) communication. In various embodiments, respectively various voice-over-internet-protocols (VOIPs) may be used. Improved electronics rack crown 102 is preferably made of plastic. In various other embodiments, respectively various other types of substantially rigid materials may be used. Video screen 106 is preferably a liquid crystal display (LCD) screen. In various other embodiments, respectively various other types of video screens 106 may be used. Passive vent set 110 assists in cooling the electronics compartment 808 (see FIG. 8).

Electronic rack cabinet 104 is preferably the DIN rail electronics rack of U.S. patent application Ser. No. 15/994,721, but the invention is not so limited. Electronic rack cabinet 104 includes a front cabinet door 118 with a lockable door handle 120, a cabinet base 122, and feet 124 (one of two visible of four labeled). Feet 124 may be, in various other embodiments, casters, sliders, or rollers. Electronic rack cabinet 104 is preferably made of steel. In various other embodiments, respectively various other types of frame and panel materials may be used, within the functional constraints of the present invention.

FIG. 2 is a rear elevation view illustrating the exemplary embodiment 100 of the improved electronics rack crown 102 of FIG. 1 mounted on the electronic rack cabinet 104 of FIG. 1, according to a preferred embodiment of the present invention. The improved electronics rack crown 102 includes vertical left and right side opposed top passive vent sets 202 (one of two labeled) and an electronic compartment cover 204. In some embodiments, passive vent sets 202 may include louvers and/or filters. Electronic rack cabinet 104 includes a rear cabinet door 210 with a locking handle 212, as well as top rear fans 208 (one of our labeled), top rear vents 206 (one of four labeled), base rear fans 214 (one of our labeled), and base rear vents 216 (one of four labeled).

FIG. 3 is a right-side elevation view illustrating the exemplary embodiment 100 of the improved electronics rack crown 102 of FIG. 1 mounted on the electronic rack cabinet 104 of FIG. 1, according to a preferred embodiment of the present invention. Right-side panel 302 is fastened to an electronic rack frame (not shown) with fasteners 310 (one of eight labeled). Right-side panel 302 supports lower right vents 304 (one of four labeled) and upper right vents 306 (one of four labeled). The improved electronics rack crown 102 includes right extension arm 308.

FIG. 4 is a left-side elevation view illustrating the exemplary embodiment 100 of the improved electronics rack crown of FIG. 1 mounted on the electronic rack cabinet 104 of FIG. 1, according to a preferred embodiment of the present invention. Left-side panel 402 is fastened to an electronic rack frame (not shown) with fasteners 410 (one of eight labeled). Left-side panel 402 supports lower left vents 404 (one of four labeled) and upper left vents 406 (one of four labeled). The improved electronics rack crown 102 includes left extension arm 408.

FIG. 5 is top plan view illustrating the exemplary embodiment of the improved electronics rack crown 102 of FIG. 1 mounted on the electronic rack cabinet 104 of FIG. 1, according to a preferred embodiment of the present invention. The electronic rack cabinet 104 includes a top horizontal perimeter frame member 504 that supports, up to edge 502, the bottom surface 806 (see FIG. 8) of the rear portion of the improved electronics rack crown 102, as well as the right extension arm 308 and the left extension arm 408. Top horizontal perimeter frame member 504 also supports top panel 506 that provides optional fan attachment accommodations 510 (one of two labeled), large cable knockouts 508 (one of three labeled), and small cable knockouts 512 (one of six labeled). The number and arrangement of large and small cable knockouts 508 and 512 is not a limitation of the present invention. The number and arrangement of the optional fan attachment accommodations 510 is not a limitation of the present invention.

Figure 6:
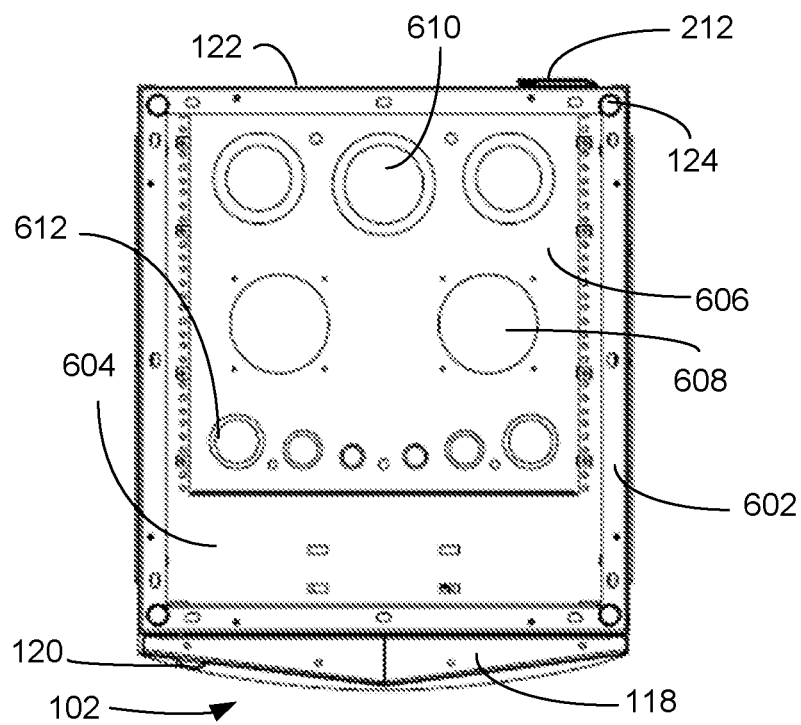
FIG. 6 is a bottom plan view illustrating the exemplary embodiment of the improved electronics rack crown of FIG. 1 mounted on the electronic rack cabinet of FIG. 1, according to a preferred embodiment of the present invention.

FIG. 6 is a bottom plan view illustrating the exemplary embodiment of the improved electronics rack crown 102 of FIG. 1 mounted on the electronic rack cabinet 104 of FIG. 1, according to a preferred embodiment of the present invention. The electronic rack cabinet 104 includes a cabinet base 122 that includes a horizontal base frame member 602 that supports bottom panel 604. Bottom panel 604 supports bottom entries panel 606 that provides optional fan attachment accommodations 608 (one of two labeled), large cable knockouts 610 (one of three labeled), and small cable knockouts 612 (one of six labeled). The number and arrangement of large and small cable knockouts 610 and 612 is not a limitation of the present invention. The number and arrangement of the optional fan attachment accommodations 608 is not a limitation of the present invention.

Figure 7:
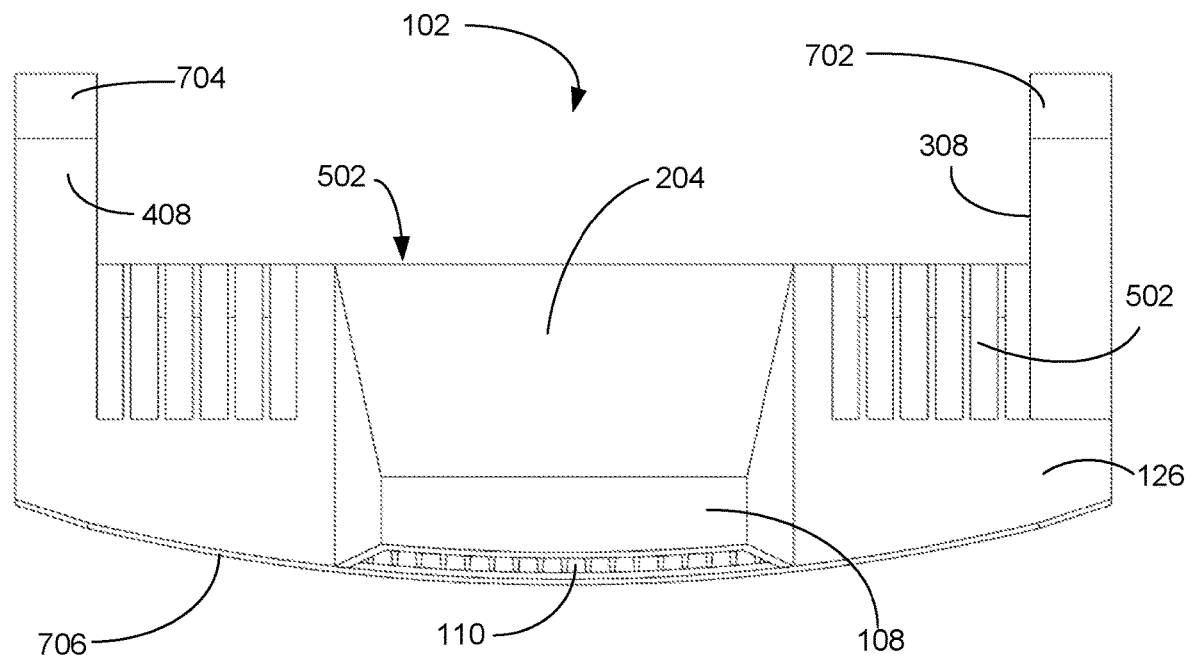
FIG. 7 is a top plan view illustrating the exemplary embodiment of the improved electronics rack crown rack of FIG. 1, according to a preferred embodiment of the present invention.

FIG. 7 is a top plan view illustrating the exemplary embodiment of the improved electronics rack crown rack 102 of FIG. 1, according to a preferred embodiment of the present invention. The improved electronics rack crown 102 includes a rack crown structure 126 including an arcuate front edge 706 and bevels 702 and 704 on top rear ends of right extension arm 308 and left extension arm 408, respectively.

Figure 8:
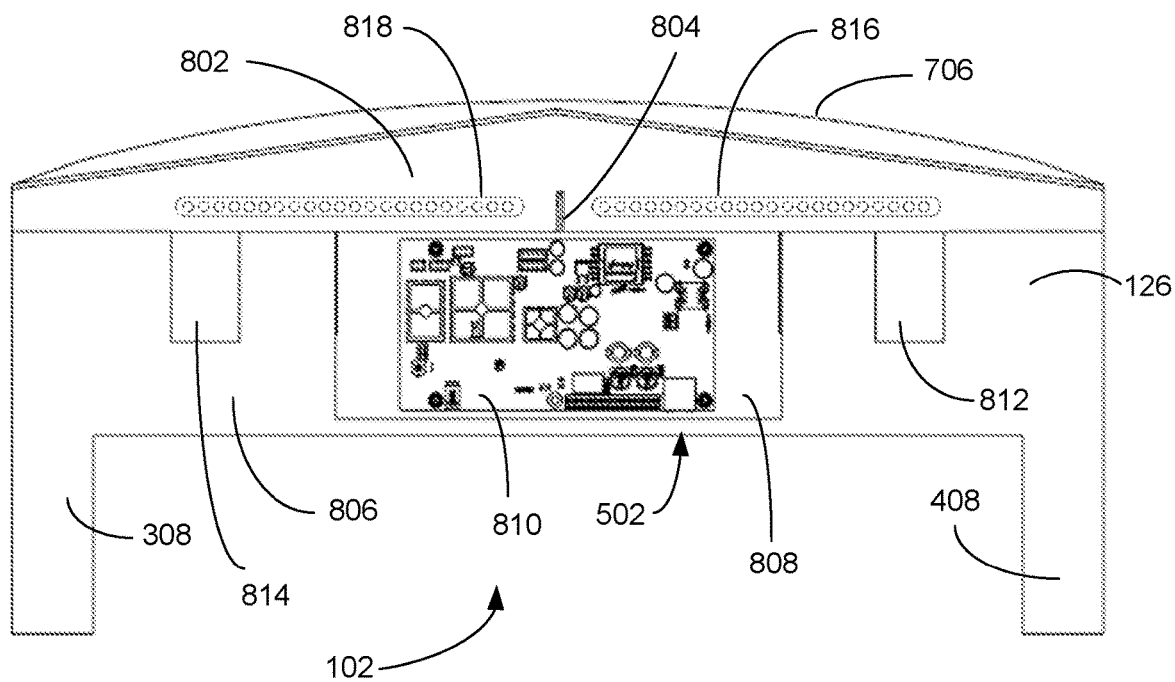
FIG. 8 is a bottom plan view illustrating the exemplary embodiment of the improved electronics rack crown rack of FIG. 1, according to a preferred embodiment of the present invention.

FIG. 8 is a bottom plan view illustrating the exemplary embodiment of the improved electronics rack crown rack 102 of FIG. 1, according to a preferred embodiment of the present invention. The bottom surfaces of right extension arm 308 and left extension arm 408 are continuous with the bottom surface 806 of the rear portion of the rack crown structure 126 of the improved electronics rack crown 102. The door interface 802 supports door OPEN/CLOSED sensor 804 which is in electronic communication with printed circuit board (PCB) 810. The door interface 802 also supports right and left LED light bars 816 and 818, which illuminate the front panels of rack-mounted electronics modules when the door 118 is open. In some embodiments, other numbers of LED light bars 816 and 818 may be used. Bottom surface 806 includes right and left arcuate grooves 812 and 814, respectively, to accommodate mounting right and left round loudspeakers 1004 and 1014 (see FIG. 10), respectively. Bottom surface 806 abuts, when installed, the top horizontal perimeter frame member 504. PCB 810 is shown installed in electronics compartment 808 underneath electronic compartment cover 204. PCB 810 supports communication, sensor data reception, data processing, executive functions, audio and video signal processing, and diagnostic electronics. PCB 810 includes various couplings for connecting respectively various inputs and outputs, a processor, and a non-volatile memory. PCB 810 preferably includes an SD card receiver providing custom data such as, for non-limiting example, contact information for remote entities, predetermined text messages for video display and automatic texting to remote entities, and contact information for on-site personnel. In some embodiments, custom data is programmed via an Internet connection. PCB 810 includes an array of configuration switches such as, for nonlimiting example, DIP switches and jumpers.

In other embodiments, a door OPEN/CLOSED sensor 804 may be provided for the rear cabinet door 210 and be in electronic communication with PCB 810.

Figure 9:
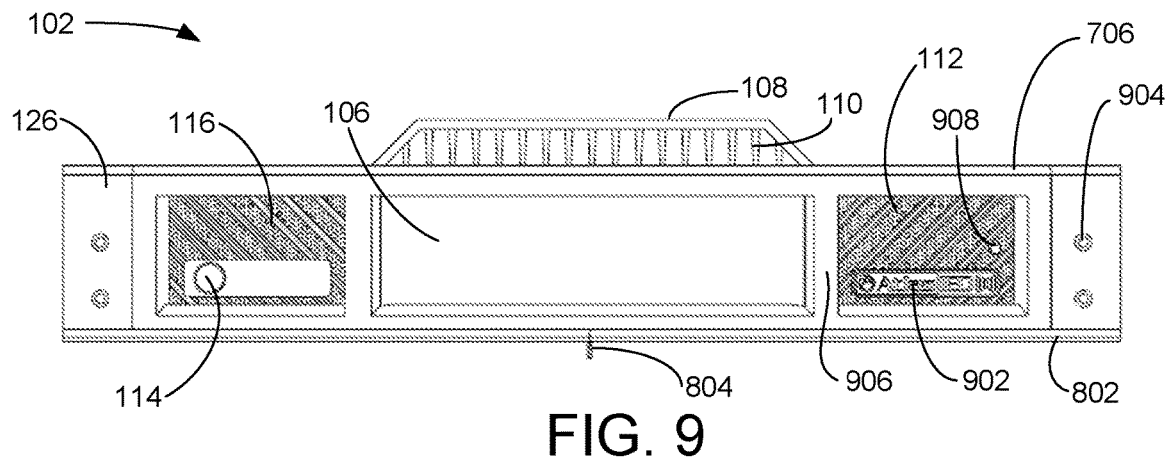
FIG. 9 is a front elevation view illustrating the exemplary embodiment of the improved electronics rack crown of FIG. 1, according to a preferred embodiment of the present invention.

FIG. 9 is a front elevation view illustrating the exemplary embodiment of the improved electronics rack crown 102 of FIG. 1, according to a preferred embodiment of the present invention. The improved electronics rack crown 102 includes a logo panel 902 attached to the right loudspeaker outer grill 112 and a microphone 908 within an opening the right loudspeaker outer grill 112. The rack crown structure 126 includes fastener openings 904 (one of four labeled) for use in attaching the improved electronics rack crown 102 to a top front soffit 2002 (see FIG. 20) of the electronic rack cabinet 104. Recessed video screen 106 is shown inside a rectangular frame 906 of the rack crown structure 126.

Figure 10:
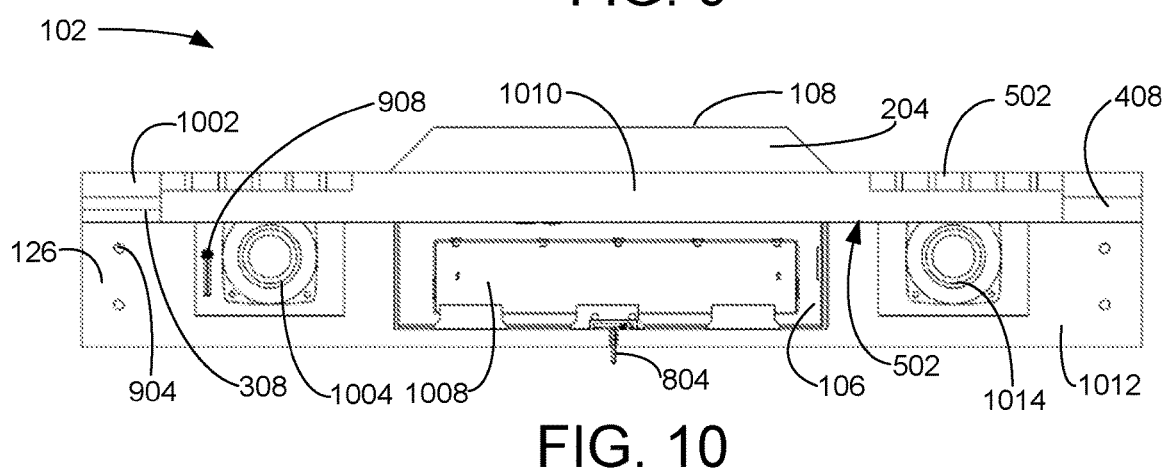
FIG. 10 is a rear elevation view illustrating the exemplary embodiment of the improved electronics rack crown of FIG. 1, according to a preferred embodiment of the present invention.

FIG. 10 is a rear elevation view illustrating the exemplary embodiment of the improved electronics rack crown 102 of FIG. 1, according to a preferred embodiment of the present invention. Key compartment cover 1002 is shown on right extension arm 308, as will be described in more detail in regard to FIG. 14. Video screen electronics 1008 are mounted on the back of video screen 106. Right and left round loudspeakers 1004 and 1014, respectively, are shown in their installed position in the rack crown structure 126. Lower back panel 1012 is designed to abut a top front soffit 2002 (see FIG. 20) of the electronic rack cabinet 104. Right and left loudspeakers 1004 and 1014, as well as video screen electronics 1008, are positioned forward of lower back panel 1012. Upper back panel 1010 of the rack crown structure 126 rises above abutting top horizontal perimeter frame member 504, when installed.

Figure 11:
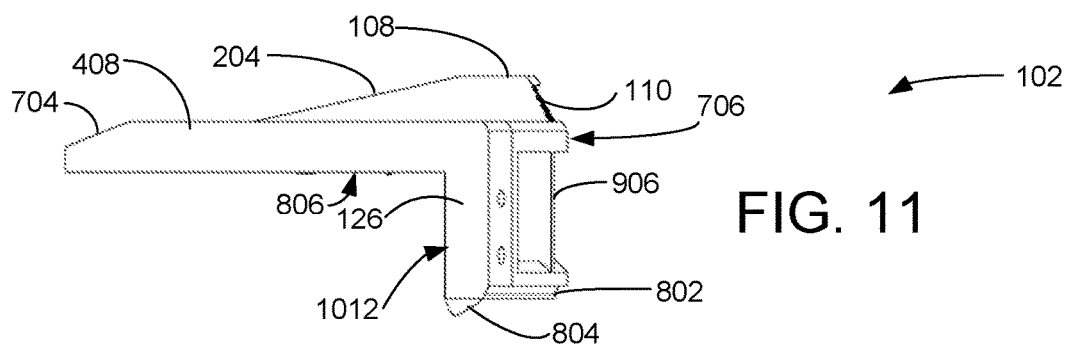
FIG. 11 is a left-side elevation view illustrating the exemplary embodiment of the improved electronics rack crown of FIG. 1, according to a preferred embodiment of the present invention.

FIG. 11 is a left-side elevation view illustrating the exemplary embodiment of the improved electronics rack crown 102 of FIG. 1, according to a preferred embodiment of the present invention. In various embodiments, relative dimensions of the rack crown structure 126 may be respectively varied. For non-limiting examples, the length of right and left extension arms 308 and 408, the height of the electronic compartment cover 204, the slope of passive vent sets 110 and 202, and the shape of the arcuate front edge 706 may be varied within the constraint of meeting the functional requirements of the present invention.

Figure 12:
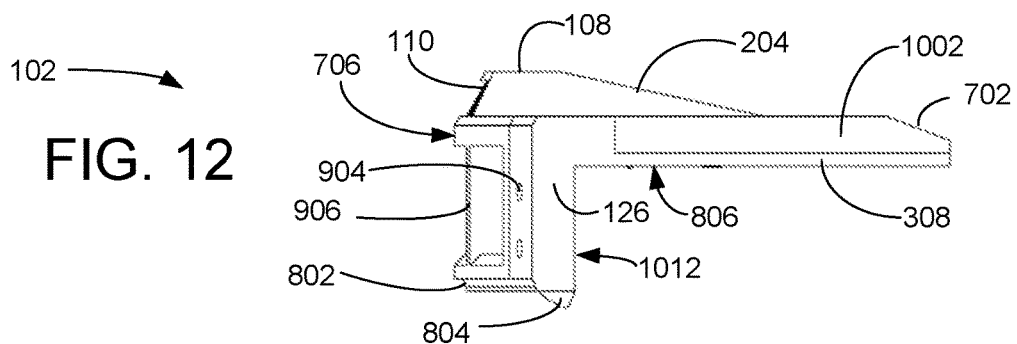
FIG. 12 is a right-side elevation view illustrating the exemplary embodiment of the improved electronics rack crown rack of FIG. 1, according to a preferred embodiment of the present invention.

FIG. 12 is a right-side elevation view illustrating the exemplary embodiment of the improved electronics rack crown rack 102 of FIG. 1, according to a preferred embodiment of the present invention. Key compartment cover 1002 is preferably of the snap-fit variety, but a sliding or hinged cover may be used in other embodiments.

Figure 13:
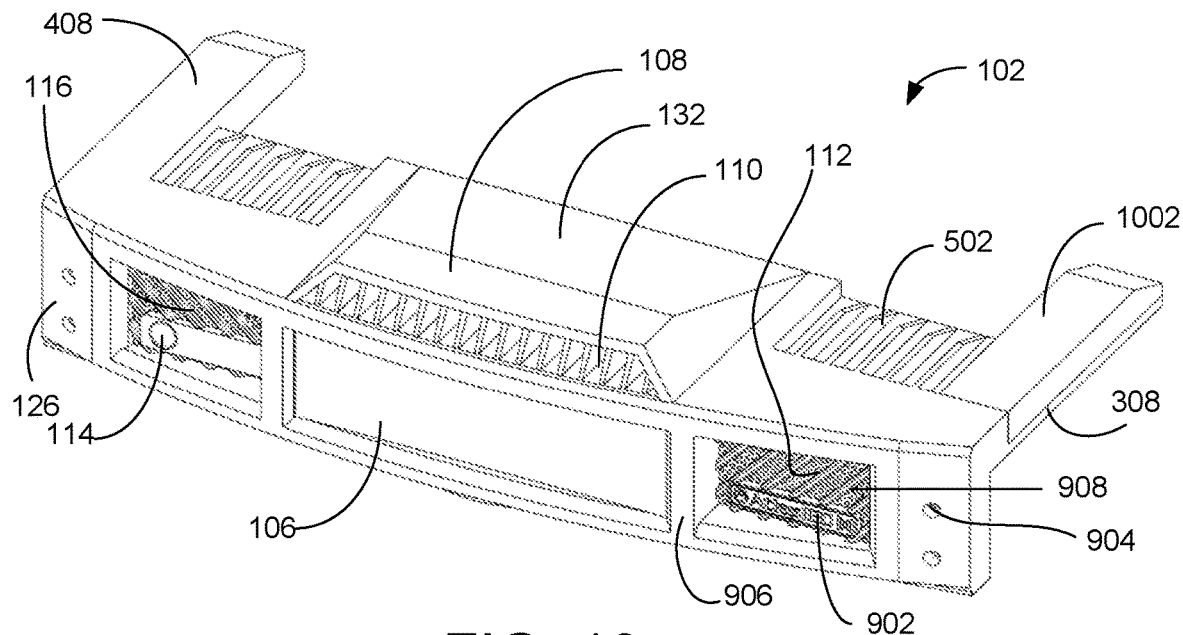
FIG. 13 is a front-top-right perspective view illustrating the exemplary embodiment of the improved electronics rack crown of FIG. 1, according to a preferred embodiment of the present invention.

FIG. 13 is a front-top-right perspective view illustrating the exemplary embodiment of the improved electronics rack crown 102 of FIG. 1, according to a preferred embodiment of the present invention. In a particular embodiment, right and left extension arms 308 and 408 may be formed with fastener holes to use in securing the improved electronics rack crown 102 to the top horizontal perimeter frame member 504.

Figure 14:
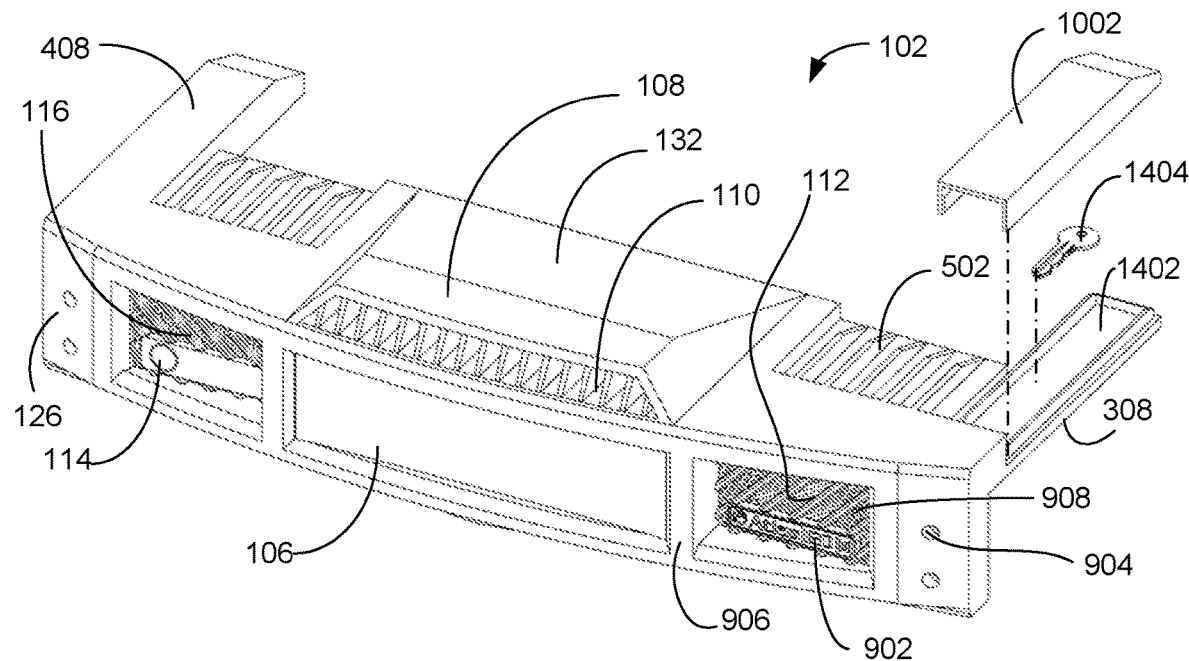
FIG. 14 is a front-top-right partially exploded perspective view illustrating the exemplary embodiment of the improved electronics rack crown of FIG. 1, according to a preferred embodiment of the present invention.

FIG. 14 is a front-top-right partially exploded perspective view illustrating the exemplary embodiment of the improved electronics rack crown 102 of FIG. 1, according to a preferred embodiment of the present invention. Key compartment cover 1002 is shown in the open state over key compartment 1402 and key 1404. Key compartment 1402 may hold more than one key. Key compartment 1402 may be of various internal shapes in respectively various embodiments. For example, the key compartment 1402 may be key-shaped. Key 1404 locks/unlocks the front cabinet door 118, the rear cabinet door 210, or both. In a particular embodiment, left extension arm 408 may also have a key compartment 1402 and a key compartment cover 1002.

Figure 15:
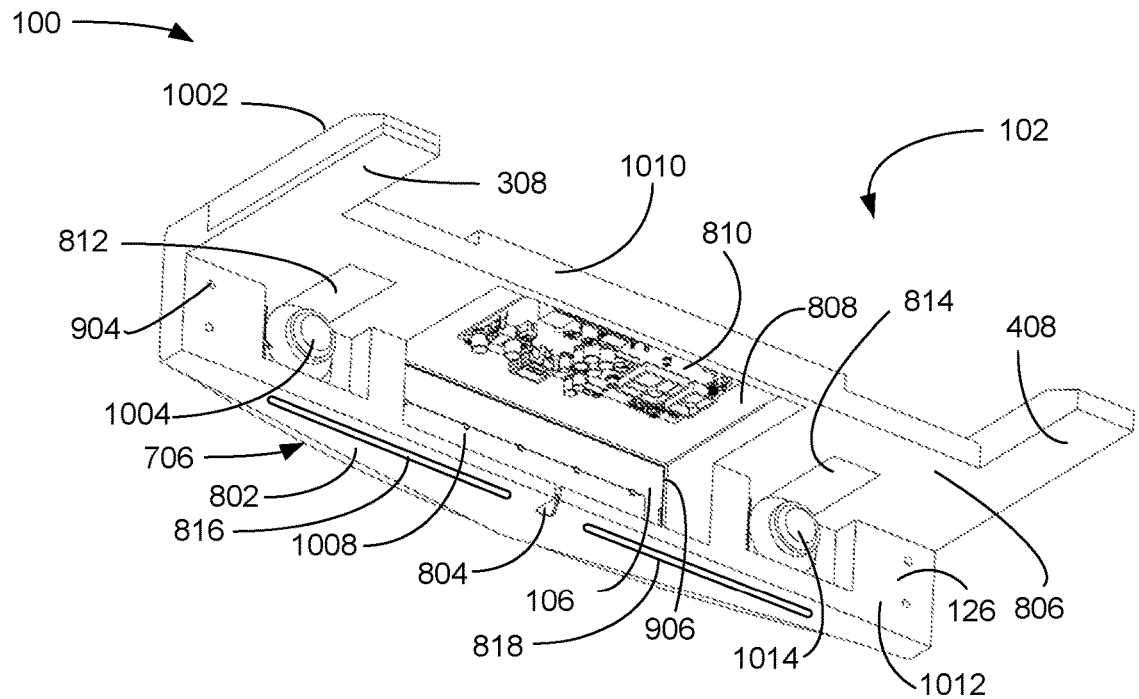
FIG. 15 is a rear-bottom-left perspective view illustrating the exemplary embodiment of the improved electronics rack crown of FIG. 1, according to a preferred embodiment of the present invention.

FIG. 15 is a rear-bottom-left perspective view illustrating the exemplary embodiment of the improved electronics rack crown 102 of FIG. 1, according to a preferred embodiment of the present invention. Right and left round loudspeakers 1004 and 1014 are shown installed in rack crown structure 126. PCB 810 is shown installed horizontally in electronics compartment 808 of the rack crown structure 126. In various embodiments, electronics may be distributed over more than one PCB 810. The electronic devices on PCB 810 do not extend below bottom surface 806 and are facing downward to improve cooling. Video screen 106 (shown from the rear) is installed below the PCB 810 and in front of the rear surface of lower back panel 1012 of the rack crown structure 126. LED light bars 816 and 818 are shown in less detail.

Figure 16:
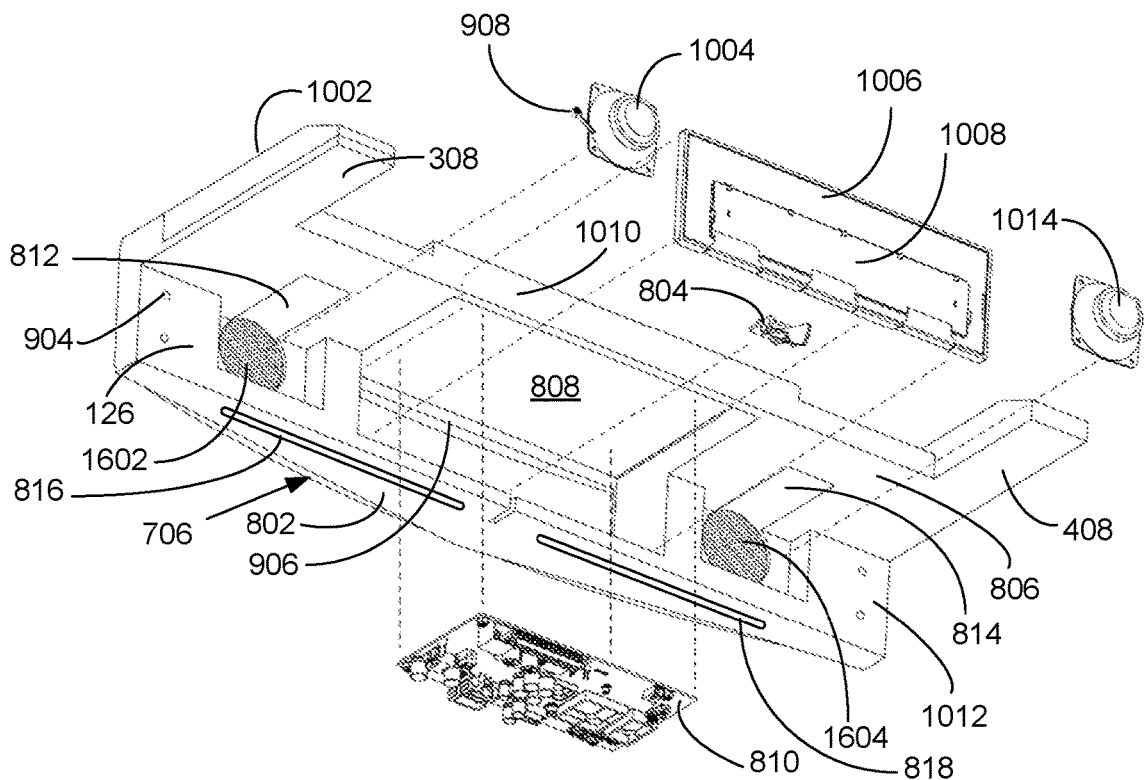
FIG. 16 is a rear-bottom-left exploded perspective view illustrating the exemplary embodiment of the improved electronics rack crown of FIG. 1, according to a preferred embodiment of the present invention.

FIG. 16 is a rear-bottom-left exploded perspective view illustrating the exemplary embodiment of the improved electronics rack crown 102 of FIG. 1, according to a preferred embodiment of the present invention. The relationship between right and left arcuate grooves 812 and 814 of the rack crown structure 126 and right and left round loudspeakers 1004 and 1014, respectively, is made plain by right and left inner loudspeaker grills 1602 and 1604, respectively. LED light bars 816 and 818 are shown in less detail.

PCB 810 receives sensor data from door OPEN/CLOSED sensor 804 to determine if the front cabinet door 118 has been opened or closed. PCB 810 may also receive sensor data from dedicated sensors within the electronic rack cabinet 104 (e.g. temperature and humidity) and sensors and alarms in rack-mounted electronics modules. In some embodiments, some sensors may be mounted on PCB 810. Communications circuitry on PCB 810 includes a Wi-Fi transceiver or a cable connectable to an Internet router, and/or a cell phone transceiver, as well as a data output to the video screen electronics 1008 and an audio output to right and left round loudspeakers 1004 and 1014. PCB 810 includes a processor and a non-volatile memory and may include voice recognition software in addition to data processing and executive functions for the improved electronics rack crown 102. Software for executing SiP or other VOIP calls is stored in a non-volatile memory on PCB 810. Additional insight on couplings on PCB 810 may be gained from reading the patent applications incorporated herein by reference.

Figure 17:
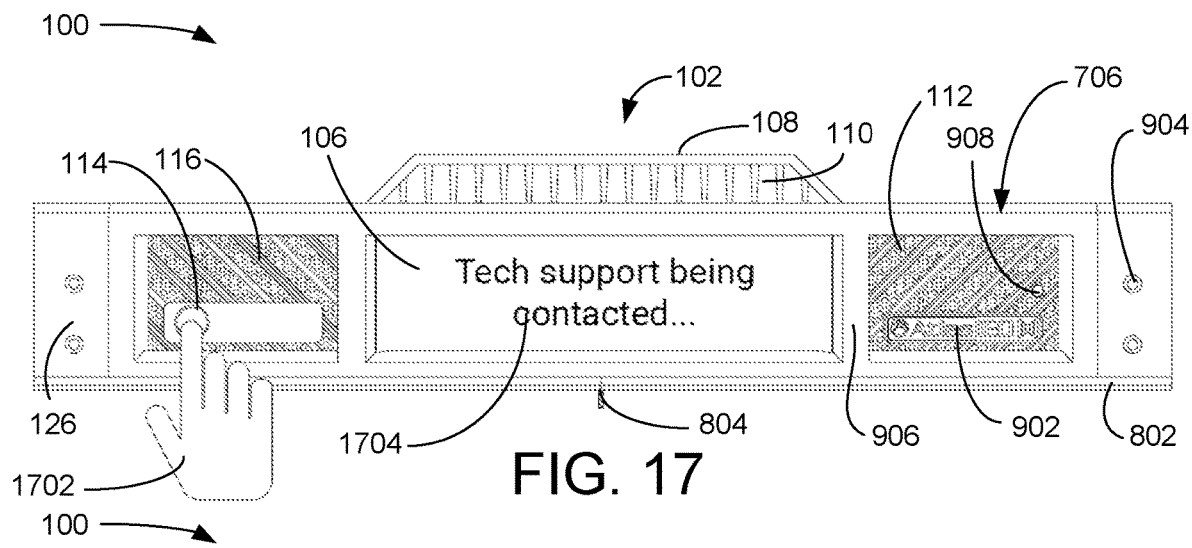
FIG. 17 is a front elevation diagrammatic view illustrating the exemplary embodiment of the improved electronics rack crown of FIG. 1 in an exemplary first step of use, according to a preferred embodiment of the present invention.

FIG. 17 is a front elevation diagrammatic view illustrating the exemplary embodiment of the improved electronics rack crown 102 of FIG. 1 in an exemplary first step of use, according to a preferred embodiment of the present invention. User 1702 manually depresses pushbutton switch 114 to contact technical support via SiP call or other VOIP call. In some embodiments, cell phone or landline telephony may be used. A text message 1704, verifying that the contact is in progress, is displayed on the video screen 106. Video screen 106 can display text, icons, symbols, etc. For example, video screen 106 can display a text message describing an anomaly in a rack-mounted electronics module that includes anomaly detection circuitry and/or software. The anomaly text message may describe the anomaly and its location.

Figure 18:
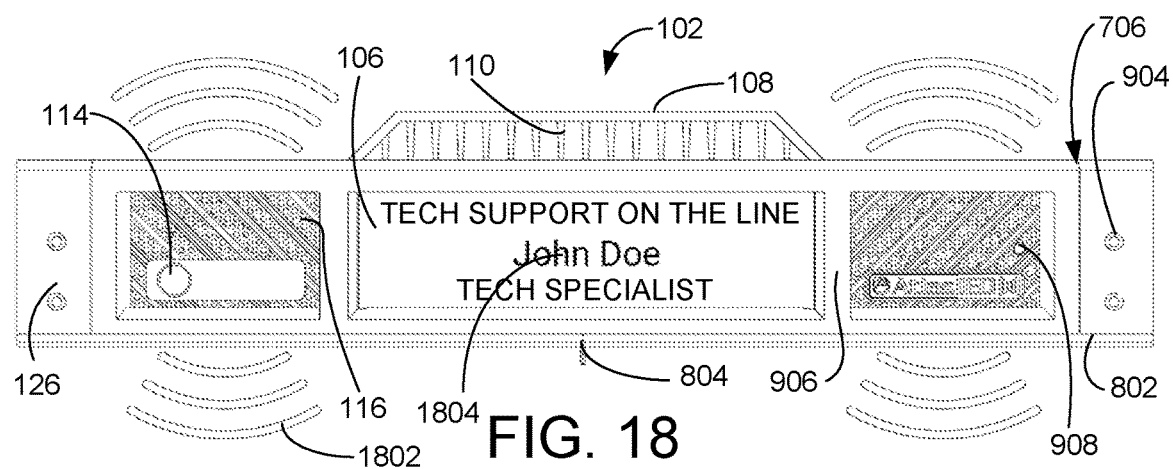
FIG. 18 is a front elevation diagrammatic view illustrating the exemplary embodiment of the improved electronics rack crown of FIG. 1 in an exemplary second step of use, according to a preferred embodiment of the present invention.

FIG. 18 is a front elevation diagrammatic view illustrating the exemplary embodiment of the improved electronics rack crown 102 of FIG. 1 in an exemplary second step of use, according to a preferred embodiment of the present invention. A further text message 1804 and audible voice output 1802 verifies that technical support has been contacted successfully.

Figure 19:
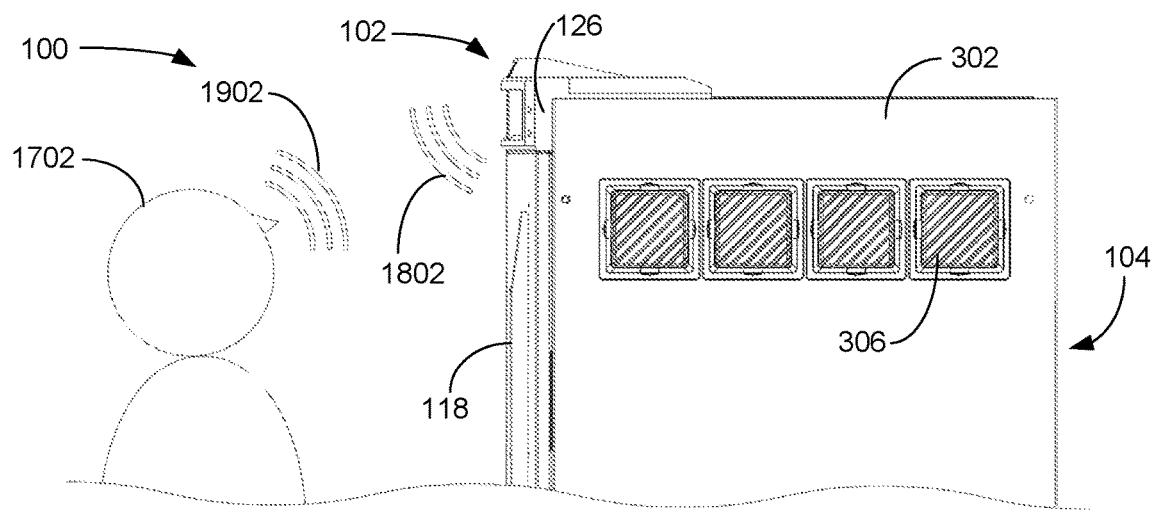
FIG. 19 is a right-side elevation diagrammatic view illustrating the exemplary embodiment of the improved electronics rack crown of FIG. 1 in an exemplary third step of use, according to a preferred embodiment of the present invention.

FIG. 19 is a right-side elevation partial diagrammatic view illustrating the exemplary embodiment of the improved electronics rack crown 102 of FIG. 1 in an exemplary third step of use, according to a preferred embodiment of the present invention. User 1702 hears the audible voice output 1802 and speaks 1902 a response that is picked up by microphone 908 and transmitted to technical support. In some embodiments, only one of the right or left round loudspeaker 1004 or 1014 is installed.

Figure 20:
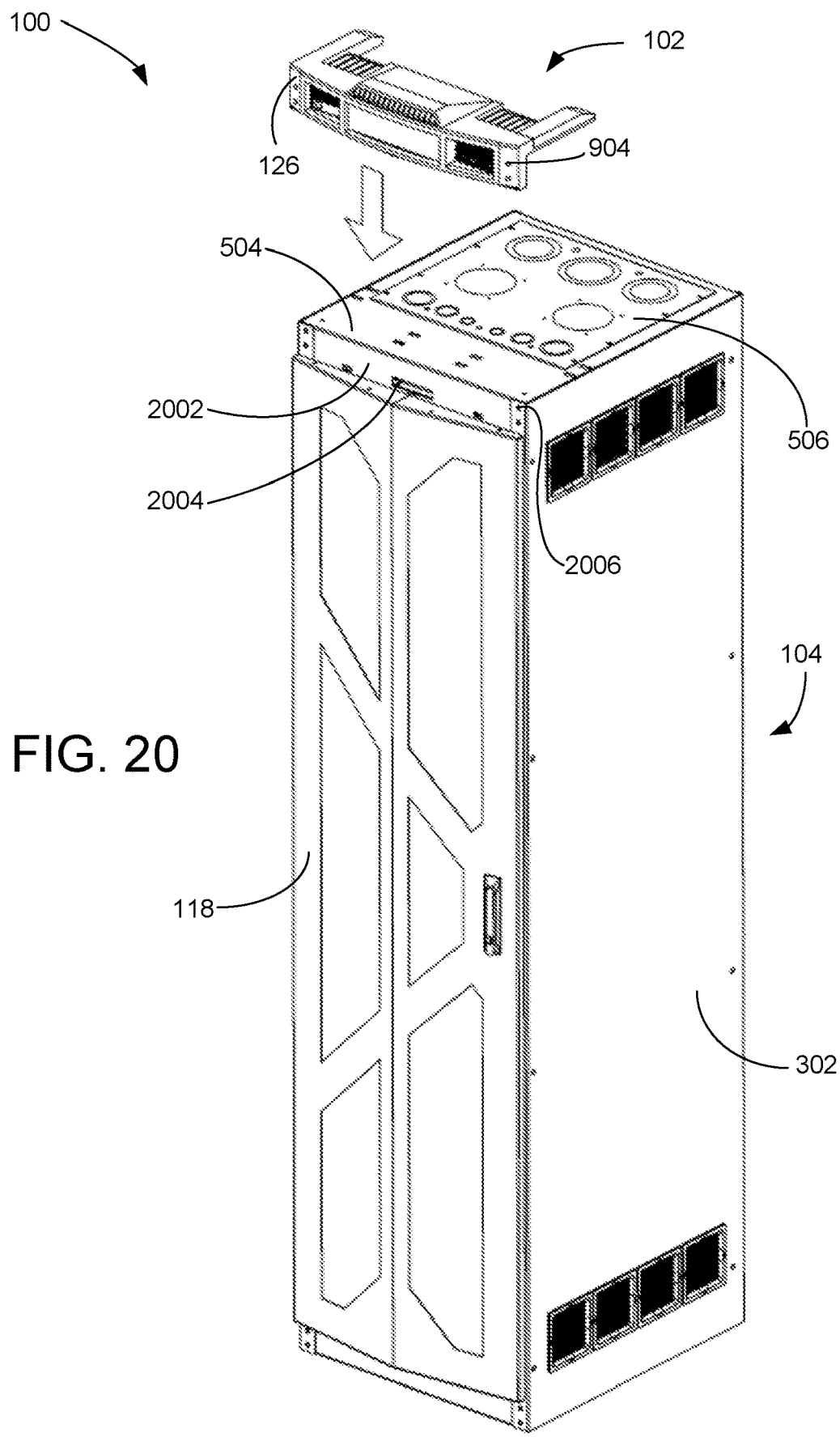
FIG. 20 is a front-top-right-side diagrammatic view of the exemplary embodiment of the improved electronics rack crown of FIG. 1 positioned to be mounted on the electronic rack cabinet of FIG. 1, according to a preferred embodiment of the present invention.

FIG. 20 is a front-top-right-side diagrammatic view of the exemplary embodiment 100 of the improved electronics rack crown 102 of FIG. 1 positioned to be mounted on the electronic rack cabinet 104 of FIG. 1, according to a preferred embodiment of the present invention. Top front soffit 2002 includes a port 2004 for wiring from remote sensors and a power source and includes fastener openings 2006 (one of four labeled) corresponding to fastener openings 904 (one of four labeled) on the improved electronics rack crown 102.

Figure 21:
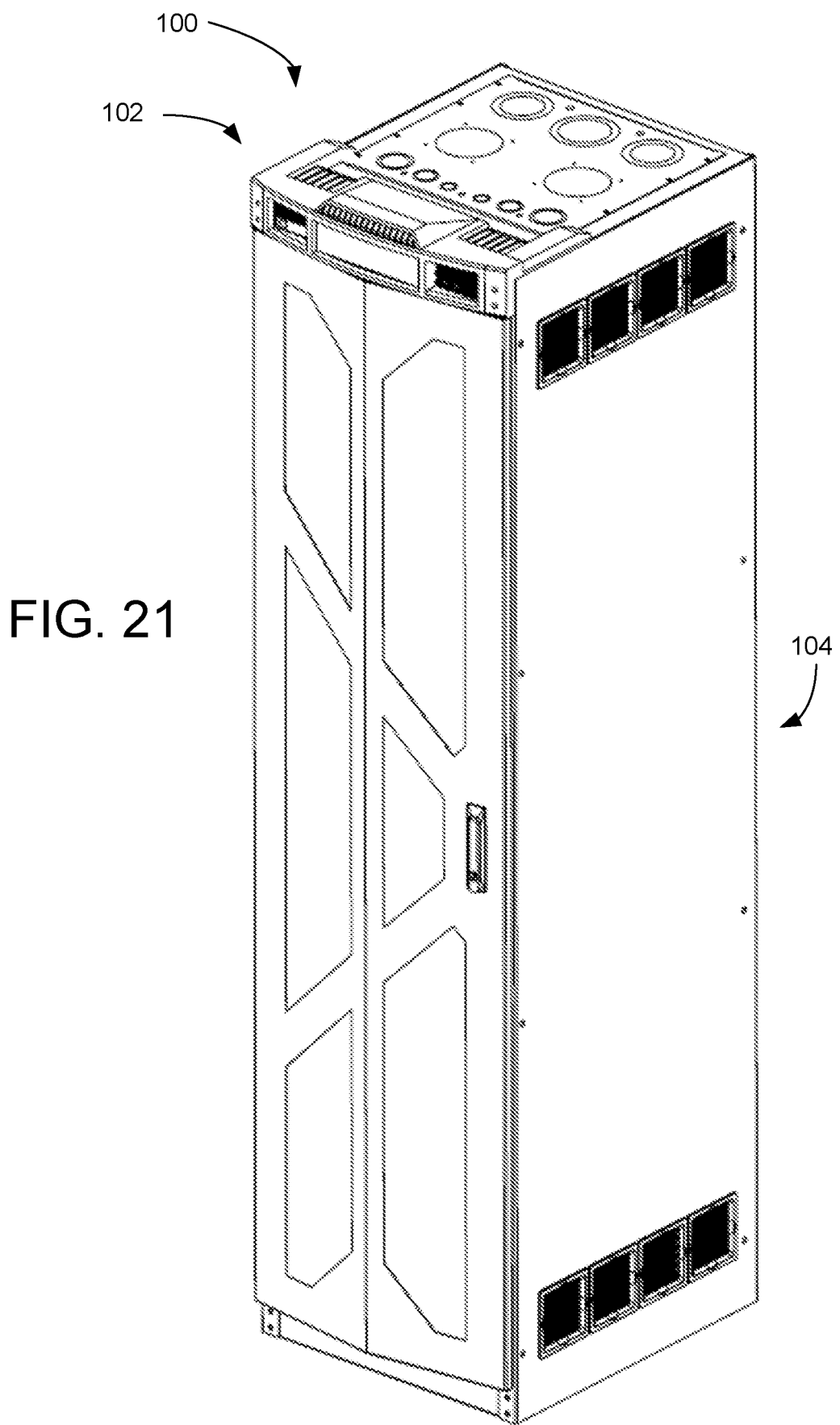
FIG. 21 is a front-top-right-side diagrammatic view of the exemplary embodiment of the improved electronics rack crown of FIG. 1 mounted on the electronic rack cabinet of FIG. 1, according to a preferred embodiment of the present invention.

FIG. 21 is a front-top-right-side diagrammatic view of the exemplary embodiment 100 of the improved electronics rack crown 102 of FIG. 1 mounted on the electronic rack cabinet 104 of FIG. 1, according to a preferred embodiment of the present invention. Electrical and electronic connections are included in the installation.

In the following claims, some functional claiming is used. There are no statements of intended use in the following claims.

I claim:
1. An electronics rack crown comprising:
   a. a rack crown structure adapted to be fastened to a top front soffit of an electronics rack cabinet;
   b. a video display screen supported in said rack crown structure and aligned to a framed opening in said rack crown structure; and
   c. a microphone supported in said rack crown structure.
2. The electronics rack crown of claim 1, comprising:
   a. at least one loudspeaker supported within said rack crown structure; and
   b. a front-facing logo panel on an outer loudspeaker grill of said rack crown structure.
3. The electronics rack crown of claim 1, comprising:
   a. at least one door OPEN/CLOSED sensor supported in said rack crown structure and partially extending below said rack crown structure; and
   b. at least one light bar, supported under a front door interface of said rack crown structure, responsive to a state of a front door OPEN/CLOSED sensor of said at least one door OPEN/CLOSED sensor.
4. The electronics rack crown of claim 1, comprising an electronics compartment within said rack crown structure.
5. The electronics rack crown of claim 4, comprising an electronic printed circuit board (PCB):
   a. housed within said electronics compartment;
   b. supporting communications, data processing, executive functions, diagnostics, and audio and video signal processing; and
   c. wherein said communications may be at least one of automatic and user initiated.
6. The electronics rack crown of claim 5, comprising a plurality of electronic wire couplings on said electronic circuit board.
7. The electronics rack crown of claim 6, wherein said PCB includes at least three of:
   a. a video screen driver;
   b. an audio processor;
   c. at least one of:
      i. a session-initiated-protocol communications capability; and
      ii. other voice-over-internet-protocol communications capability;
   d. at least one of:
      i. a Wi-Fi transceiver;
      ii. a cable connector adapted to receive an Internet cable from an Internet router;
      iii. a cellular telephone transceiver; and
      iv. a landline telephone transceiver;
   e. an analog audio output coupling;
   f. a fault event input coupling;
   g. at least one input coupling for said OPEN/CLOSED door sensor;
   h. a voltage sensor input coupling;
   i. an array of configuration switches;
   j. a reset button;
   k. a voice communications activation switch input coupling;
   l. at least one of:
      i. a temperature sensor input coupling; and
      ii. a temperature sensor;

m. at least one of:
   i. a humidity sensor input coupling; and
   ii. a humidity sensor;
n. a power input coupling.

8. The electronics rack crown of claim 7, comprising a front-mounted manual voice communications activation switch.

9. The electronics rack crown of claim 1, comprising first and second opposed parallel extension arms extending rearward.

10. The electronics rack crown of claim 9, wherein at least one of said first and second opposed parallel arms comprises a re-closable compartment.

11. The electronics rack crown of claim 4, comprising:
   a. a sloped passive vent above said electronics compartment; and
   b. left and right top opposed sets of vertically directed passive vents.

12. An electronics rack crown comprising:
   a. a rack crown structure adapted to be fastened to a top front soffit of an electronics rack;
   b. a video display screen supported in said rack crown structure and aligned to a framed opening in said rack crown structure;
   c. a microphone supported in said rack crown structure;
   d. at least one loudspeaker supported within said rack crown structure;
   e. at least one door OPEN/CLOSED sensor supported in said rack crown structure and partially extending below said rack crown structure; and
   f. at least one light bar, supported under a front door interface of said rack crown structure, responsive to a state of a front door OPEN/CLOSED sensor of said at least one door OPEN/CLOSED sensor.

13. The electronics rack crown of claim 12, comprising:
   a. a front-mounted manual voice communications activation switch;
   b. first and second opposed extension arms extending rearward; and
   c. wherein at least one of said first and second opposed arms comprises a re-closable compartment.

14. The electronics rack crown of claim 12, comprising:
   a. a front-facing logo panel mounted on an outer speaker grill;
   b. an electronics compartment within said rack crown structure;
   c. a printed circuit board (PCB):
      i. housed within said electronics compartment; and
      ii. supporting communications, data processing, executive functions, diagnostics, and audio and video signal processing; and
      iii. wherein said communications may be at least one of automatic and user initiated; and
   d. a plurality of electronic wire couplings on said PCB.

15. The electronics rack crown of claim 14, wherein said PCB includes at least seven of:
   a. a video screen driver;
   b. an audio processor;
   c. at least one of:
      i. a session-initiated-protocol communications capability; and
      ii. other voice-over-internet-protocol communications capability;
   d. at least one of:
      i. a Wi-Fi transceiver;
      ii. a cable connector adapted to receive an Internet cable from an Internet router;
      iii. a cellular telephone transceiver; and
      iv. a landline telephone transceiver;
   e. an analog audio output coupling;
   f. a fault event input coupling;
   g. an input coupling for said OPEN/CLOSED door sensor;
   h. an array of configuration switches;
   i. a voice communications activation switch input coupling;
   j. at least one of:
      i. a temperature sensor input coupling; and
      ii. a temperature sensor;
   k. at least one of:
      i. a humidity sensor input coupling; and
      ii. a humidity sensor;
   l. a power input coupling.

16. The electronics rack crown of claim 14, comprising:
   a. a sloped passive vent above said electronics compartment; and
   b. left and right top opposed sets of vertically directed passive vents.

17. An electronics rack crown comprising:
   a. a rack crown structure adapted to be fastened to a top front soffit of an electronics rack;
   b. a video display screen supported in said rack crown structure and aligned to a framed opening in said rack crown structure;
   c. a microphone supported in said rack crown structure;
   d. at least one loudspeaker supported within said rack crown structure;
   e. at least one door OPEN/CLOSED sensor supported in said rack crown structure and partially extending below said rack crown structure;
   f. at least one light bar, supported under a front door interface of said rack crown structure, responsive to a state of a front door OPEN/CLOSED sensor of said at least one door OPEN/CLOSED sensor;
   g. a front-facing logo panel mounted on an outer speaker grill;
   h. an electronics compartment within said rack crown structure;
   i. a printed circuit board (PCB):
      i. housed within said electronics compartment; and
      ii. supporting communications, data processing, executive functions, and audio and video signal processing; and
      iii. wherein said communications may be at least one of automatic and user initiated; and
   j. a plurality of electronic wire couplings on said PCB.

18. The electronics rack crown of claim 17, wherein said PCB includes at least nine of:
   a. a video screen driver;
   b. an audio processor;
   c. at least one of:
      i. a session-initiated-protocol communications capability; and
      ii. other voice-over-internet-protocol communications capability;
   d. at least one of:
      i. a Wi-Fi transceiver;
      ii. a cable connector adapted to receive an Internet cable from an Internet router;
      iii. a cellular telephone transceiver; and
      iv. a landline telephone transceiver;
   e. an analog audio output coupling;
   f. a fault event input coupling;

g. an input coupling for said OPEN/CLOSED door sensor;
h. an array of configuration switches;
i. a reset button;
j. a voice communications activation switch input coupling;
k. at least one of:
   i. a temperature sensor input coupling; and
   ii. a temperature sensor;
l. at least one of:
   i. a humidity sensor input coupling; and
   ii. a humidity sensor; and
m. a power input coupling.

19. The electronics rack crown of claim 17, comprising:
a. a sloped passive vent above said electronics compartment; and
b. right and left opposed sets of vertically directed passive vents on top of said rack crown structure.

20. The electronics rack crown of claim 17, comprising:
a. a front-mounted manual voice communications activation switch;
b. first and second opposed extension arms extending rearward; and
c. wherein at least one of said first and second opposed arms comprises a re-closable compartment.

* * * * *